(12) United States Patent
Tsarfati et al.

(10) Patent No.: US 8,638,494 B2
(45) Date of Patent: Jan. 28, 2014

(54) REFLECTIVE OPTICAL ELEMENT AND METHOD OF MANUFACTURING THE SAME

(71) Applicant: Carl Zeiss SMT GmbH, Oberkochen (DE)

(72) Inventors: Tim Tsarfati, Prevessin-Moëns (FR); Erwin Zoethout, Utrecht (NL); Eric Louis, Ljsselstein (NL); Frederik Bijkerk, Bosch en Duin (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/791,100

(22) Filed: Mar. 8, 2013

(65) Prior Publication Data

US 2013/0188248 A1    Jul. 25, 2013

Related U.S. Application Data

(63) Continuation of application No. 12/986,856, filed on Jan. 7, 2011, now Pat. No. 8,411,355, which is a continuation of application No. PCT/EP2009/003905, filed on May 30, 2009.

(60) Provisional application No. 61/079,307, filed on Sep. 7, 2008.

(30) Foreign Application Priority Data

Jul. 9, 2008  (DE) .......................... 10 2008 040 265

(51) Int. Cl.
*F21V 9/06* (2006.01)

(52) U.S. Cl.
USPC ............ 359/359; 359/360; 359/584; 359/589

(58) Field of Classification Search
USPC ............ 359/356, 360, 580, 584–589; 378/34, 378/84, 145, 204, 210
See application file for complete search history.

(56) References Cited

U.S. PATENT DOCUMENTS

| 5,310,603 A | 5/1994 | Fukuda et al. |
| 5,485,499 A | 1/1996 | Pew et al. |
| 6,295,164 B1 | 9/2001 | Murakami et al. |
| 6,396,900 B1 | 5/2002 | Barbee, Jr. et al. |
| 6,836,533 B2 | 12/2004 | Shimizu |
| 7,960,701 B2 | 6/2011 | Bowering et al. |
| 2001/0033421 A1 | 10/2001 | Murakami et al. |

(Continued)

FOREIGN PATENT DOCUMENTS

| DE | 10 2008 007 387 A1 | 8/2008 |
| WO | 9309545 A1 | 5/1993 |

(Continued)

*Primary Examiner* — Frank Font
(74) *Attorney, Agent, or Firm* — Sughrue Mion, PLLC

(57) ABSTRACT

A reflective optical element e.g. for use in EUV lithography, configured for an operating wavelength in the range from 5 nm to 12 nm, includes a multilayer system with respective layers of at least two alternating materials having differing real parts of the refractive index at the operating wavelength. The material having the lower real part of the refractive index is a nitride or a carbide. "Alternatively, the material having the lower real part of the refractive index is thorium, uranium or barium and the material having the higher real part of the refractive index is boron or boron carbide.

4 Claims, 10 Drawing Sheets

(56) References Cited

U.S. PATENT DOCUMENTS

| | | |
|---|---|---|
| 2003/0185341 A1 | 10/2003 | Michaelsen |
| 2004/0047446 A1 | 3/2004 | Platonov |
| 2004/0121134 A1 | 6/2004 | Bijkerk et al. |
| 2005/0199830 A1 | 9/2005 | Bowering et al. |
| 2005/0213199 A1 | 9/2005 | Imai et al. |
| 2005/0225741 A1 | 10/2005 | Yamamoto et al. |
| 2005/0276988 A1 | 12/2005 | Trenkler |
| 2008/0088916 A1 | 4/2008 | Benoit et al. |
| 2009/0009858 A1 | 1/2009 | Feigl et al. |
| 2010/0027107 A1 | 2/2010 | Yakshin et al. |
| 2013/0070332 A1 * | 3/2013 | Bowering et al. ............. 359/359 |

FOREIGN PATENT DOCUMENTS

| | | |
|---|---|---|
| WO | 2004023495 A1 | 3/2004 |
| WO | 2006066563 A1 | 6/2006 |
| WO | 2007090364 A2 | 8/2007 |
| WO | 2008095663 A1 | 8/2008 |

* cited by examiner

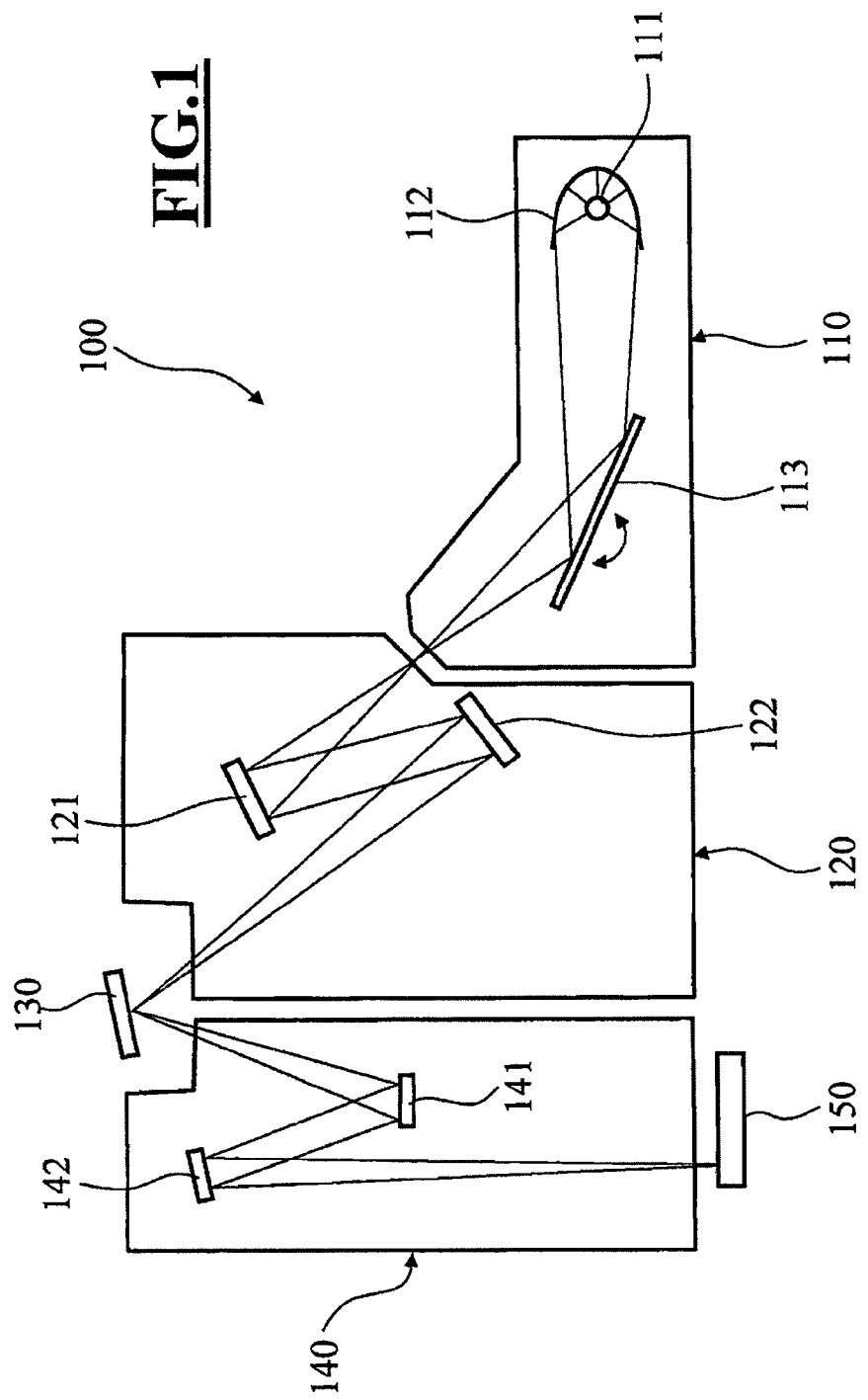

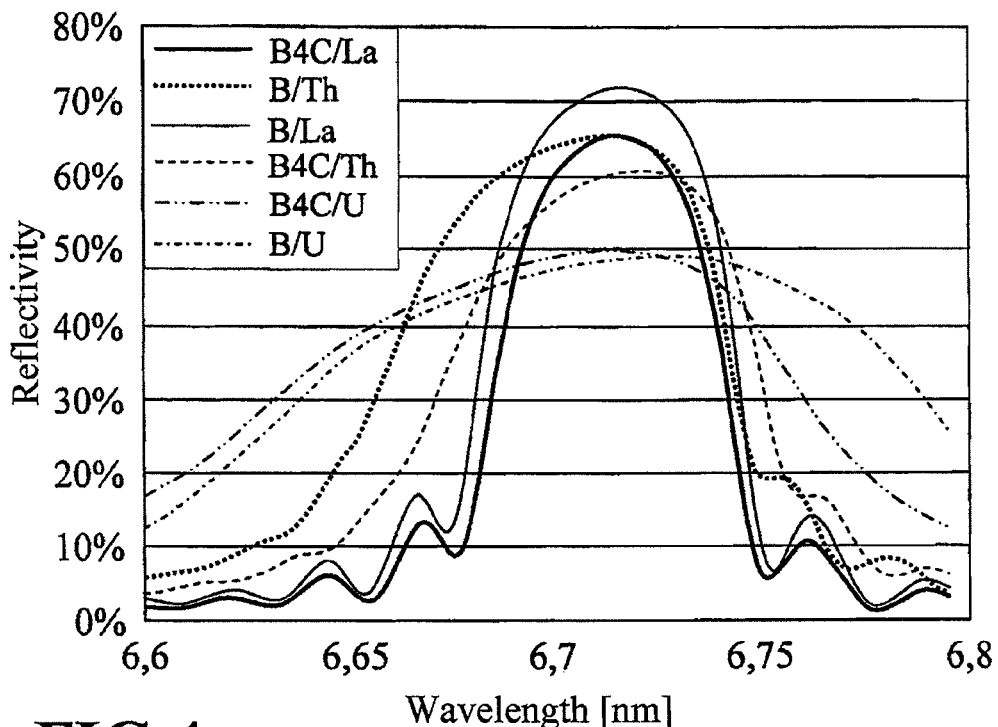
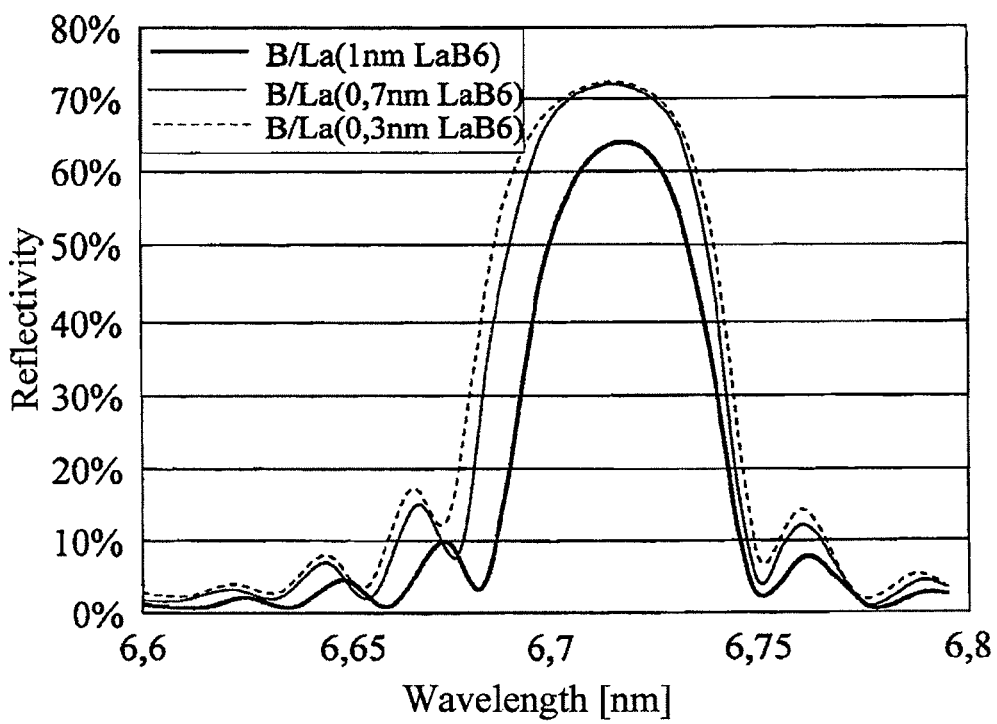

REFLECTIVE OPTICAL ELEMENT AND METHOD OF MANUFACTURING THE SAME

This is a Continuation of U.S. application Ser. No. 12/986,856, with a filing date of Jan. 7, 2011, which is a Continuation of International Application PCT/EP2009/003905, with an international filing date of May 30, 2009, which was published under PCT Article 21(2) in German, and which claims priority under 35 U.S.C. §119(a) to German Patent Application No. 10 2008 040 265.6, filed on Jul. 9, 2008. This Continuation also claims the benefit under 35 U.S.C. §119(e)(1) of U.S. Provisional Application No. 61/079,307, filed on Jul. 9, 2008. The entire contents of each of the above applications are hereby incorporated into the present Continuation by reference.

FIELD OF THE INVENTION

The present invention relates to reflective optical elements for an operating wavelength in the range from 5 nm to 12 nm comprising a multilayer system of at least two alternating materials having different real parts of the refractive index at the operating wavelength, and their use.

Furthermore, the present invention relates to a projection system and an illumination system, and to an EUV lithography apparatus comprising at least one such reflective optical element. Moreover, the present invention relates to a method of manufacturing such reflective optical elements.

BACKGROUND AND STATE OF THE ART

In EUV lithography apparatuses, reflective optical elements for the extreme ultra violet (EUV) or soft X-ray wavelength range (e.g. wavelengths between about 5 nm and 20 nm), such as photomasks or multilayer mirrors, are used for the lithographic processing of semiconductor components. Since EUV lithography apparatuses usually have a plurality of reflective optical elements, they must have the highest possible reflectivity in order to ensure sufficient overall reflectivity. Since a plurality of reflective optical elements are usually arranged in series in an EUV lithography apparatus, the slightest deterioration in reflectivity of each individual reflective optical element has a substantial effect on the overall reflectivity within the EUV lithography apparatus.

Reflective optical elements for the EUV and soft X-ray wavelength range, usually have multilayer systems. These are alternately applied layers of a material having a higher real part of the refractive index at the operating wavelength (also referred to as spacer) and a material having a lower real part of the refractive index at the operating wavelength (also referred to as absorber), wherein an absorber-spacer pair forms a stack. This essentially simulates a crystal, wherein its lattice planes correspond to the absorber layers, on which Bragg reflections occur. The thicknesses of the individual layers as well as of the repetitive stacks can be constant across the entire multilayer system, or they can vary depending on which reflection profile is to be achieved.

For operating wavelengths in the wavelength range between 5 nm and 12 nm, in particular, the maximum reflectivity theoretically achievable by multilayer systems is smaller than in the wavelength range from about 12 nm to 20 nm. Also, the bandwidth of the reflected radiation is substantially smaller. An additional problem is that in the materials hitherto frequently used, e.g. lanthanum as an absorber and boron or boron carbide as a spacer, strong intermixing of the individual layers, forming a mixed layer, for example, of lanthanum boride, occurs even at room temperature, in particular at the interface between the boron or boron carbide and the lanthanum. This leads to a significant reduction in both the actual maximum reflectivity and the reflected bandwidth. Since usually a plurality of reflective optical elements are arranged in series in an EUV lithography apparatus, even slight deteriorations in the maximum reflectivity and bandwidth of each of the individual reflective optical elements over their lifespans has a pronounced effect on the overall reflectivity.

SUMMARY OF THE INVENTION

It is an object of the present invention to provide reflective optical elements for operating wavelengths in the soft X-ray and extreme ultraviolet wavelength ranges ensuring sufficiently high maximum reflectivities and reflected bandwidths in actual use over an extended period of time.

According to a first aspect of the invention, this object is achieved by a reflective optical element configured for an operating wavelength in the range from 5 nm to 12 nm, including a multilayer system with respective layers of at least two alternating materials having differing real part of the refractive index at the operating wavelength. At least at one interface from the material having the higher real part of the refractive index to the material having the lower real part of the refractive index, or from the material having the lower real part of the refractive index to the material having the higher real part of the refractive index, an additional layer of a nitride or a carbide of the material having the lower real part of the refractive index is provided.

Preferably, the material having the lower real part of the refractive index is lanthanum, thorium or uranium.

It has been found that providing intermediate layers of nitrides or carbides, particularly in multilayer systems with lanthanum, thorium or uranium as an absorber, results in thermally and thermodynamically more stable multilayer systems, in which no substantial intermixing of the individual layers occurs even over longer periods of time or at increased temperatures. In this manner, the optical properties, such as the maximum reflectivity and the reflected bandwidth of reflective optical elements having such multilayer systems, remain within a reliable range over their entire lifespan. Surprisingly, it has been found that inserting intermediate layers of nitride or carbide only leads to small reductions in the maximum reflectivity or the bandwidth compared with multilayer systems without these intermediate layers. In particular, these reductions are smaller than the reductions that have to be accepted due to strong intermixing of the absorber and spacer layers. In some multilayer systems it is even possible to achieve a slight improvement of the optical properties of the resulting reflective optical elements, i.e. of the maximum reflectivity and/or the reflected bandwidth, by inserting the intermediate layers.

According to a second aspect of the invention, the object is achieved by a reflective optical element configured for an operating wavelength in the range from 5 nm to 12 nm, comprising a multilayer system with respective layers of at least two alternating materials having differing real parts of the refractive index at the operating wavelength, wherein the material having the lower real part of the refractive index is a nitride or a carbide.

Preferably, the material having the lower real part of the refractive index is lanthanum nitride, thorium nitride, lanthanum carbide or thorium carbide.

It has been found that even the replacement of the absorber by its nitride or its carbide, in particular in the case of thorium or lanthanum as an absorber, leads to reductions of the maximum reflectivity and the reflected bandwidth that are smaller than the reductions due to the absorber and spacer layers intermixing, in particular with multilayer systems having thorium or lanthanum as an absorber material and boron or boron carbide as a spacer material. The maximum reflectivity and the reflected bandwidth are sometimes even increased, while at the same time the thermal and thermodynamic stability are increased.

According to a third aspect of the invention, the object is achieved by a reflective optical element configured for an operating wavelength in the range from 5 nm to 12 nm, having a multilayer system with respective layers of at least two alternating materials having differing real parts of the refractive index at the operating wavelength, wherein the material having the lower real part of the refractive index is thorium, uranium or barium.

It has been found that multilayer systems on the basis of thorium as an absorber have lower maximum reflectivities at the operating wavelength in the range from about 5 nm to 12 nm compared with multilayer systems on the basis of lanthanum as an absorber. However, this is essentially compensated by wider bandwidths of reflected radiation.

According to a fourth aspect, the object is achieved by providing at least one of the above-mentioned reflective optical elements that is configured for reflecting radiation in the wavelength range from 5 nm to 12 nm and is also configured for an operating temperature ranging from 20° C. to 600° C.

According to a fifth aspect, the object is achieved by providing at least one of the above-mentioned reflective optical elements that is configured as a collector of radiation in the wavelength range of 5 nm to 12 nm in an EUV lithography apparatus.

According to further aspects of the invention, the object is achieved by a projection system, in particular for an EUV lithography apparatus, provided with at least one of the above-mentioned reflective optical elements, by an illumination system, in particular for an EUV lithography apparatus, provided with at least one of the above-mentioned reflective optical elements, by a beam-shaping system, in particular for an EUV lithography apparatus provided with at least one of the above-mentioned reflective optical elements, and by an EUV lithography apparatus provided with at least one of the above-mentioned optical elements.

According to yet another aspect of the invention, the object is achieved by a method of manufacturing an optical element as described above, wherein the layers of at least one material are applied with a plasma-based process.

In a preferred embodiment, a layer of the material having the lower real part of the refractive index is first applied, and then subsequently exposed to a nitrogen- or carbon-containing plasma.

In a further preferred embodiment, the application of a layer of the material having the lower real part of the refractive index is at least partially carried out with the aid of a nitrogen- or carbon-containing plasma.

Advantageous embodiments can be found in the dependent claims.

BRIEF DESCRIPTION OF THE DRAWINGS

The present invention will be described in greater detail in the following, with reference to various exemplary embodiments, wherein:

FIG. 1 schematically shows an embodiment of an EUV lithography apparatus;

FIG. 3 shows the reflectivity as a function of the wavelength for reflective optical elements having multilayer systems with thorium, lanthanum or uranium as an absorber;

FIG. 4a shows the reflectivity as a function of the wavelength for reflective optical elements having lanthanum/boron multilayer systems with different thicknesses of the mixed layers;

DETAILED DESCRIPTION OF EXEMPLARY EMBODIMENTS

Figure 2A:
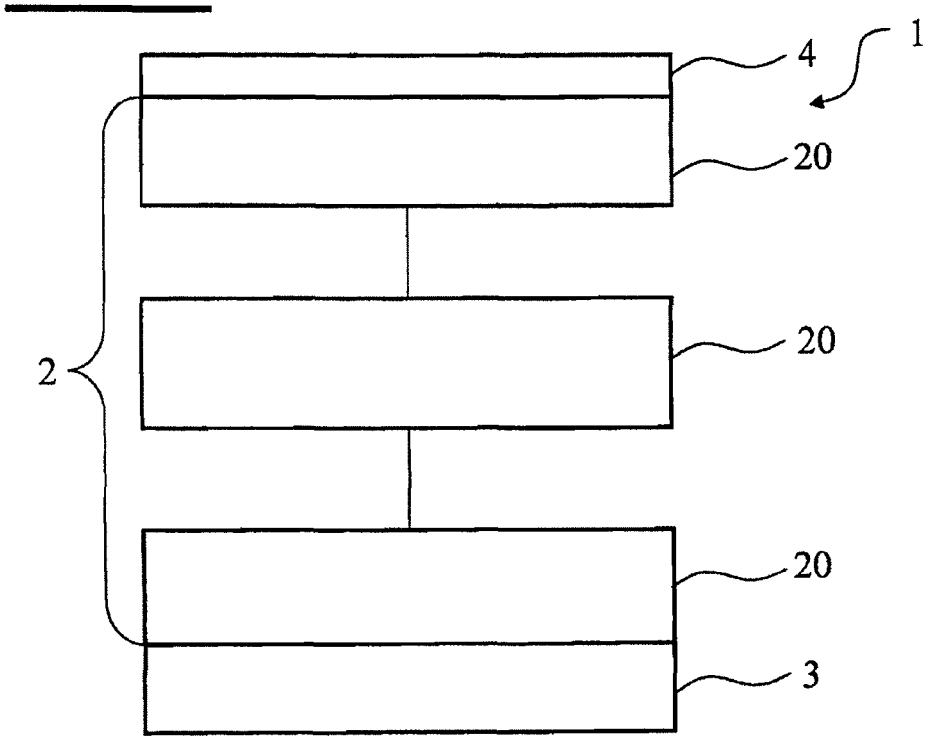
FIGS. 2a-d schematically show the structure of a reflective optical element and various multilayer systems.

FIG. 1 schematically shows an EUV lithography apparatus 100, which includes a beam-shaping system 110, an illumination system 120, a photomask 130 and a projection system 140.

A plasma source or also a synchrotron can serve, for example, as a radiation source 111. For the wavelength range from 5 nm to 12 nm, in particular, X-ray lasers (X-FEL) are also suitable as a radiation source. The radiation emitted is first focused by a collector mirror 112. Moreover, a monochromator 113 is used to filter out the desired operating wavelength by varying the incident angle. In the wavelength range mentioned, the collector mirror 112 and the monochromator 113 are usually formed as reflective optical elements having a multilayer system of at least two alternating materials with differing real parts of the refractive index at the operating wavelength in order to achieve reflection of the radiation of the operating wavelength. Collector mirrors are usually dish-like reflective optical elements to achieve a focusing or collimating effect. Both collector mirror 112 and monochromator 113 can be formed as reflective optical elements on the basis of lanthanum, thorium, uranium or barium, as will be described in detail below. Since collector mirrors are arranged in very close proximity to the radiation source in the beam path, they are exposed to high heat loads. For this reason collector mirrors having a multilayer system comprising lanthanum, thorium, uranium or barium are particularly suitable.

The operating beam processed in beam-shaping system 110 with respect to wavelength and spatial distribution is then introduced into the illumination system 120. In the example shown in FIG. 1, illumination system 120 has two mirrors 121, 122 configured as multilayer mirrors in the present example. Mirrors 121, 122 guide the beam onto photomask 130, which has the structure to be imaged onto wafer 150. Photomask 130 is also a reflective optical element for the EUV and soft X-ray wavelength ranges, which is exchanged depending on the manufacturing process. The beam reflected by photomask 130 is projected onto wafer 150 with the aid of projection system 140, which results in the structure of the photomask being imaged onto wafer 150. Projection system 140, in the example shown, includes two mirrors 141, 142, also configured as multilayer mirrors in the present example. It should be noted that both projection system 140 and illumination system 120 could have as few as one mirror or as many as three, four, five or more mirrors.

In the example shown in FIG. 1, all mirrors 121, 122, 141, 142 are reflective optical elements on the basis of lanthanum, thorium, uranium or barium, as will be explained in more detail below. Optionally, photomask 130 can also be such a reflective optical element.

FIGS. 2a-d show a reflective optical element 1 in an exemplary manner for the extreme ultraviolet and soft X-ray wavelength ranges, in particular for use in EUV lithography apparatuses, for example as mirrors for the projection or illumination system or even as a photomask, collector mirror or monochromator. FIG. 2a schematically shows the generic structure of the multilayer system 2. Multilayer system 2, in the present example, has been manufactured by successively coating a substrate 3 with different materials having differing complex refractive indices. Moreover, a protective layer 4, for protection against external influences such as contamination, and which can be composed of a plurality of different material layers, has been applied onto the multilayer system 2.

Figure 2B:
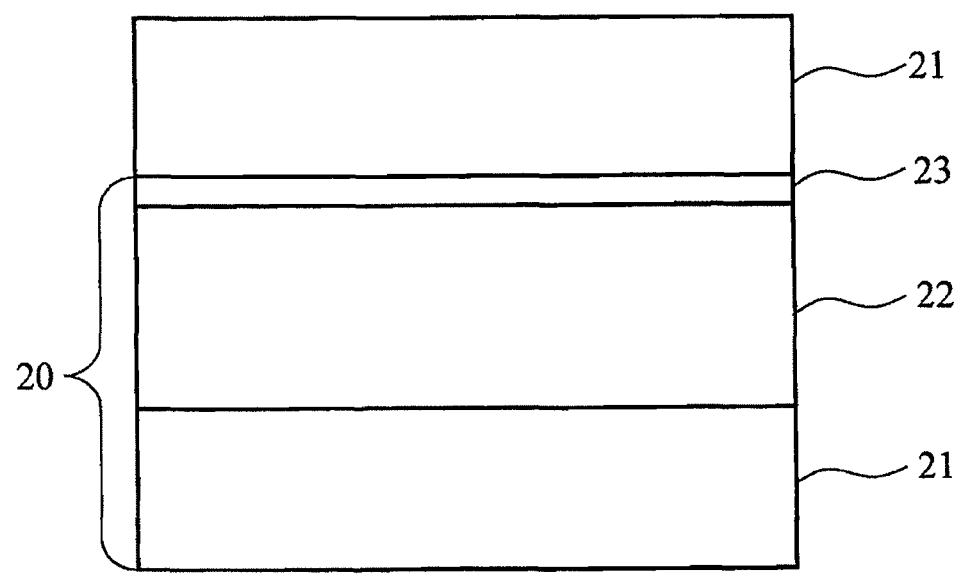
Figure 2C:
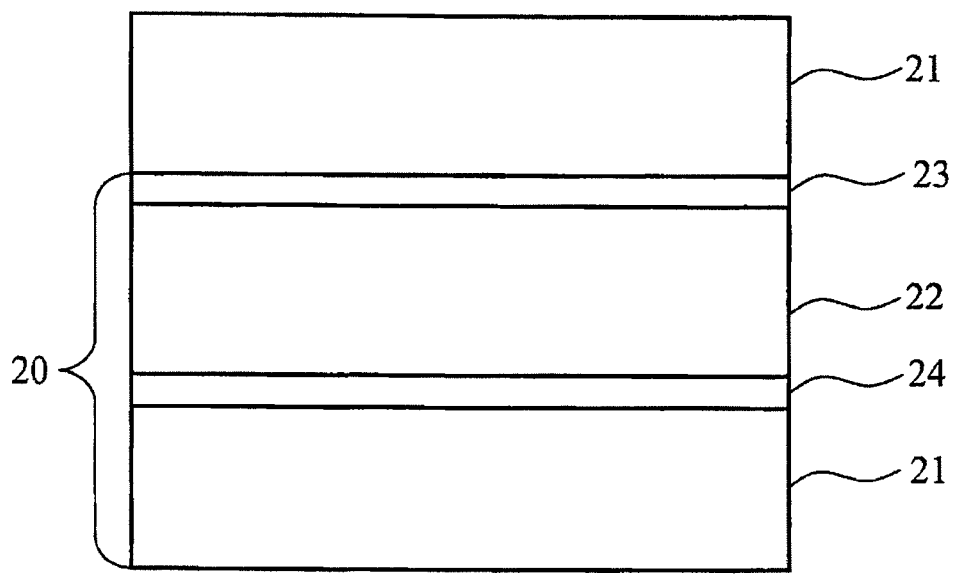
Figure 2D:
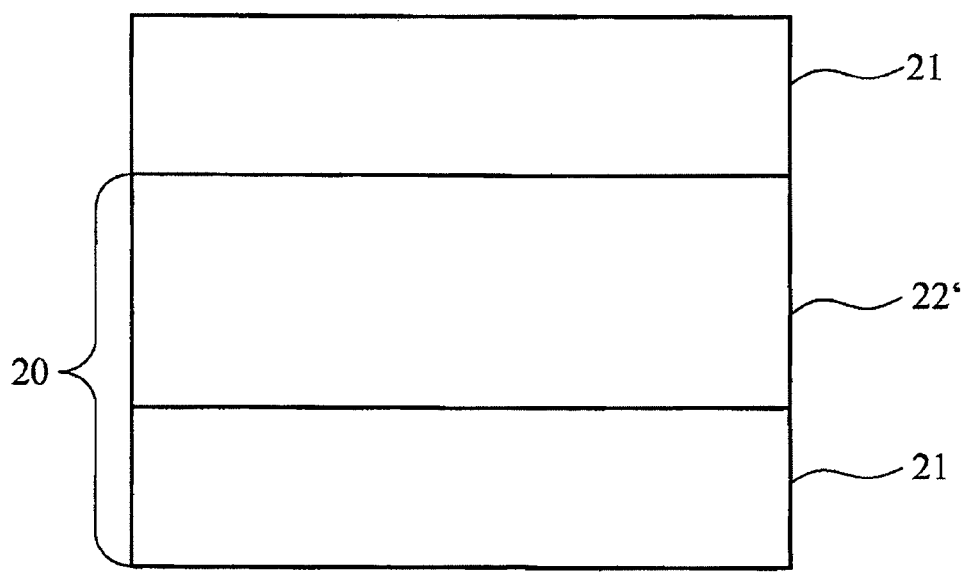

The multilayer system 2 includes multiple repetitive stacks 20, the structure of which is schematically shown in FIGS. 2b-d for various preferred embodiments. The layers of a stack 20 resulting in sufficiently high reflection at an operating wavelength in particular by the multiple repetition of stack 20, are the generally designated absorber layers 22, 22' of material having a lower real part of the refractive index and the generally designated spacer layers 21 of a material having a higher real part of the refractive index. This, in a way, simulates a crystal, wherein the absorber layers 22, 22' correspond to the lattice planes within the crystal, which have a distance from each other defined by each spacer layer 21 and on which reflection of the incident EUV or soft X-ray radiation occurs. The thicknesses of the layers are selected such that the radiation reflected on each absorber layer 22, 22' constructively interferes at a certain operating wavelength to thus achieve a high reflectivity of the reflective optical element. It should be noted that the thicknesses of the individual layers 21, 22, 22', 23, 24 as well as of the repetitive stacks 20 can be constant across the entire multilayer system, or can also vary depending on which reflection profile is to be achieved. In particular, multilayer systems can be optimized for certain wavelengths at which the maximum reflectivity and/or the reflected bandwidth is greater than at other adjacent wavelengths. The respective reflective optical element 1 is used, for example, in EUV lithography with radiation of this wavelength, which is why this wavelength, for which the reflective optical element 1 has been optimized, is also referred to herein as the operating wavelength.

In contrast to multilayer systems for operating wavelengths in the range from 12 nm to 20 nm, which often use molybdenum as an absorber material and silicon as a spacer material, the requirements for the multilayer systems for operating wavelengths in the range from 5 nm to 12 nm are much stricter, in particular toward the shorter wavelengths. While 50 stacks are sufficient, for example, with a molybdenum/silicon multilayer system, to achieve a maximum reflectivity of substantially above 70%, about 200 stacks are necessary, for example, for a multilayer system having lanthanum, thorium, uranium or barium as absorbers and boron or boron carbide for shorter operating wavelengths to achieve a reflectivity of about 50% or more. An additional difficulty is that the full width at half maximum of the reflectivity curve, which is a measure of the reflected bandwidth, is only about 10% of the full width at half maximum of the reflectivity curves of molybdenum/silicon multilayer systems. It must be additionally considered that in real multilayer systems, in particular at the interfaces between the spacer and the absorber, intermixing occurs with the formation of an additional layer, which can have a substantial deleterious effect on the contrast between the spacer and absorber layers. This results in even lower maximum reflectivities and bandwidths.

To counteract the deterioration of the optical properties it is suggested according to the example shown in FIG. 2b to provide an additional layer 23 of a nitride or carbide of the absorber material at the interface between the absorber 22 and the spacer 21. Nitrides and carbides of the absorber material have the advantage of being more thermodynamically stable than the mixed layers formed of the absorber and spacer materials. Their thickness remains constant over longer periods of time than that of mixed layers so that the contrast between the spacer and the absorber layers remains essentially constant. Their thermal stability is also higher. With particularly thin nitride or carbide layers 23, the contrast may even be slightly increased in comparison to systems without this intermediate layer. The carbide or nitride layer 23 preferably has a thickness of 1 nm maximum, advantageously up to 0.5 nm, preferably up to 0.4 nm, particularly preferably up to 0.3 nm. Advantageously, the carbide or nitride layer 23 is applied as a self-terminating layer. In such cases it can be achieved that the carbide or nitride layer 23 be essentially regarded as a monolayer. The intermediate layer of nitride or carbide has a particularly pronounced contrast-increasing effect, in particular, at the interface between absorber 22 and spacer 21.

In the present example shown in FIG. 2c, both an additional layer 23 of a nitride or carbide of the absorber material is provided at the interface between absorber 22 and spacer 21, and an additional layer 24 of a nitride or carbide of the spacer material is provided at the interface between spacer 21 and absorber 22 in order to increase the thermodynamic and thermal stability of the multilayer system.

In the example shown in FIG. 2d, instead of an additional nitride or carbide layer, the nitride or carbide layer of a suitable absorber material is used as an absorber layer 22', which not only results in thermally and thermodynamically relatively stable multilayer systems but also ensures satisfactory maximum reflectivities and bandwidths. As an alternative to the nitrides and carbides, thorium, uranium or barium can also be used as a material for the absorber layer 22' with positive effect.

FIG. 3 shows, in an exemplary manner, the reflectivity as a function of the wavelength for the multilayer systems thorium/boron, thorium/boron carbide, lanthanum/boron, lanthanum/boron carbide, uranium/boron and uranium/boron carbide. Each of these systems has 200 stacks. The thickness of a stack is 3.4 nm in the present example. The spacer layer thickness is about 1.7 nm, the absorber layer thickness is about 1.4 nm. Additionally, a mixed layer of thorium boride and lanthanum boride and uranium boride, respectively, has been formed at a thickness of about 0.3 nm. The operating wavelength for all four systems lies in the range between 6.70 nm and 6.75 nm. Overall, the multilayer systems with thorium as an absorber material have a lower maximum reflectivity than the multilayer systems having lanthanum as an absorber material. This is compensated, however, with respect to the overall reflectivity by a substantially greater bandwidth of the reflected radiation. This effect can be seen even more clearly with uranium as an absorber material. It is also to be observed that the systems having boron carbide as a spacer material have a lower reflectivity with respect to the maximum reflectivity and the bandwidth than the systems having boron as a spacer material. The latter have the drawback, however, that they are thermodynamically somewhat less stable so that their useful life is a bit shorter.

The effect of the increasing intermixing of the absorber and spacer materials over time is shown in an exemplary manner in FIG. 4a for a lanthanum/boron multilayer system. Based on the lanthanum/boron multilayer system already shown in FIG. 3, the reflectivity of the mixed layer at a thickness of 0.7 nm and 1 nm is additionally shown. While the maximum reflectivity is not noticeably reduced for a mixed layer of lanthanum boride at a thickness of 0.7 nm, a substantial reduction of the bandwidth must be reckoned with. When the thickness of the mixed layer is 1 nm, the maximum reflectivity as well as the bandwidth is severely reduced.

Figure 4B:
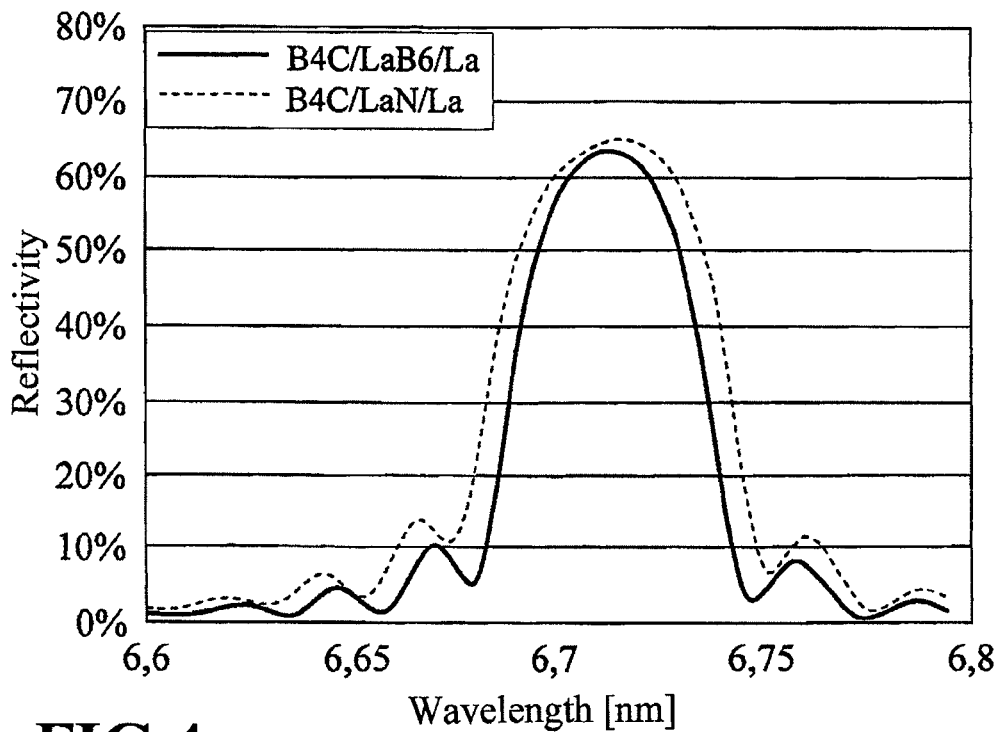
FIG. 4b shows the reflectivity as a function of the wavelength for reflective optical elements having a lanthanum/boron carbide multilayer system with a mixed layer and with a lanthanum nitride intermediate layer.

To increase the thermal stability of the multilayer systems for the wavelength range from about 5 nm to 12 nm, a lanthanum nitride layer is provided according to the example shown in FIG. 4b, for example, between the absorber layers of lanthanum and spacer layers of boron carbide. Both systems, again, have 200 stacks having a thickness of 3.4 nm to provide for better comparability. Both the lanthanum nitride layer and the lanthanum boride layer have a thickness of 0.3 nm. The multilayer system with the lanthanum nitride layer is not only thermally more stable but results in the maximum reflectivity being about 1.3% higher and a half-width being even about 20% higher as compared to the lanthanum/boron multilayer system, in which a mixed layer of lanthanum boride having a thickness of 0.3 nm has already formed.

Figure 4C:
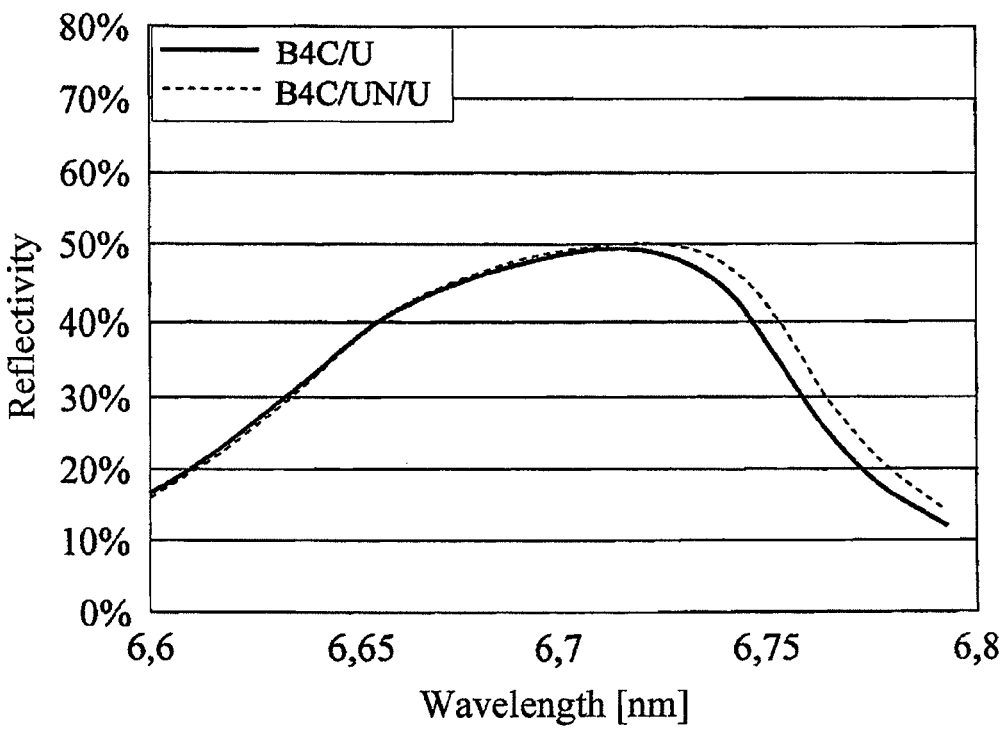
FIG. 4c shows the reflectivity as a function of the wavelength for reflective optical elements having a uranium/boron carbide multilayer system, and with a uranium/uranium nitride/boron carbide multilayer system.

FIG. 4c shows the positive effect of an absorber nitride layer between the absorber and the spacer taking a uranium/boron carbide multilayer system as an example. The uranium nitride layer arranged in the present example on top of a uranium layer and below a boron carbide layer as seen in the direction of layer growth, results both in an increase of the maximum reflectivity and in a longer half-time. To improve comparability, the stack thickness is 3.4 nm and the nitride layer has a thickness of 0.7 nm as in the previous examples.

FIGS. 5a to 8b show reflectivity curves as a function of the wavelength for diverse examples of multilayer systems having thorium or lanthanum as an absorber material and boron or boron carbide as a spacer material. All systems have been optimized for an operating wavelength in the range of 6.70 nm to 6.75 nm. They have 200 stacks of a thickness of 3.4 nm, wherein the spacer layer has a thickness of 1.7 nm and the absorber layer a thickness of 1.4 nm. The layers of a nitride or carbide of the absorber materials have a thickness of 0.3 nm. In cases where an additional layer of a nitride or a carbide of the spacer material is provided, it also has a thickness of 0.3 nm and correspondingly the spacer layer a thickness of 1.4 nm. In the thorium/boron, thorium/boron carbide, lanthanum/boron, lanthanum/boron carbide systems, a mixed layer of about 0.3 nm is present at the interfaces between the spacer and the absorber. In the systems having a nitride or a carbide as the absorber material, the absorber layer has a thickness of 1.7 nm. At the interface between the absorber and the spacer, this mixed layer is less pronounced because in many cases and with most of the coating methods, the materials applied to the surface to be coated to apply a spacer layer are more reactive than those used for applying an absorber layer.

It should be noted that the number values indicated here are only to be understood as examples, and both the thicknesses of the individual layers and the stack number can be varied at will in order to create a layer of the operating wavelength in the wavelength range from about 5 nm to 12 nm and to achieve a desired reflection profile, for example by varying the layer thicknesses, or stack thicknesses.

Figure 5A:
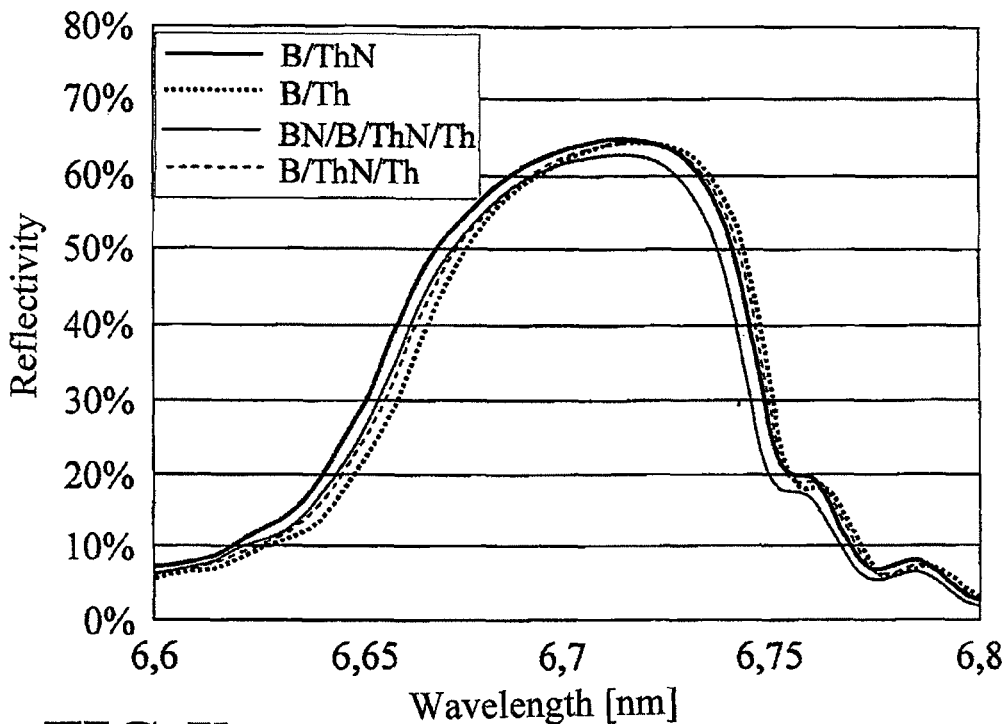
FIGS. 5a, b show the reflectivity as a function of the wavelength for reflective optical elements having a multilayer system with thorium as an absorber and thorium nitride intermediate layers.
Figure 5B:
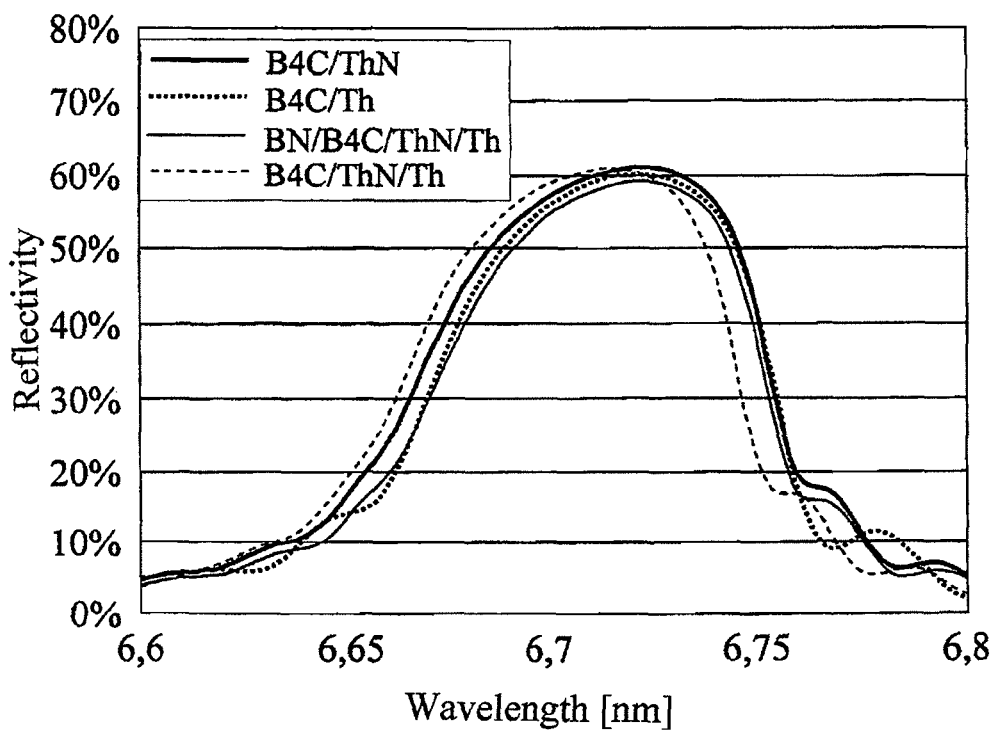

FIG. 5a shows the reflectivity curves for the thorium/boron systems alone or with one or two additional nitride layers and the thorium nitride/boron system. The system having two nitride layers has the lowest maximum reflectivity and a slightly smaller bandwidth. In compensation it has a higher thermodynamic stability. Both the provision of a thorium nitride intermediate layer and of thorium nitride as an absorber material results in slightly increased maximum reflectivities and larger bandwidths as compared with thorium/boron, wherein this effect is particularly pronounced with thorium nitride as an absorber material. This can basically also be seen for the corresponding systems having boron carbide as a spacer material, as shown in FIG. 5b.

Figure 6A:
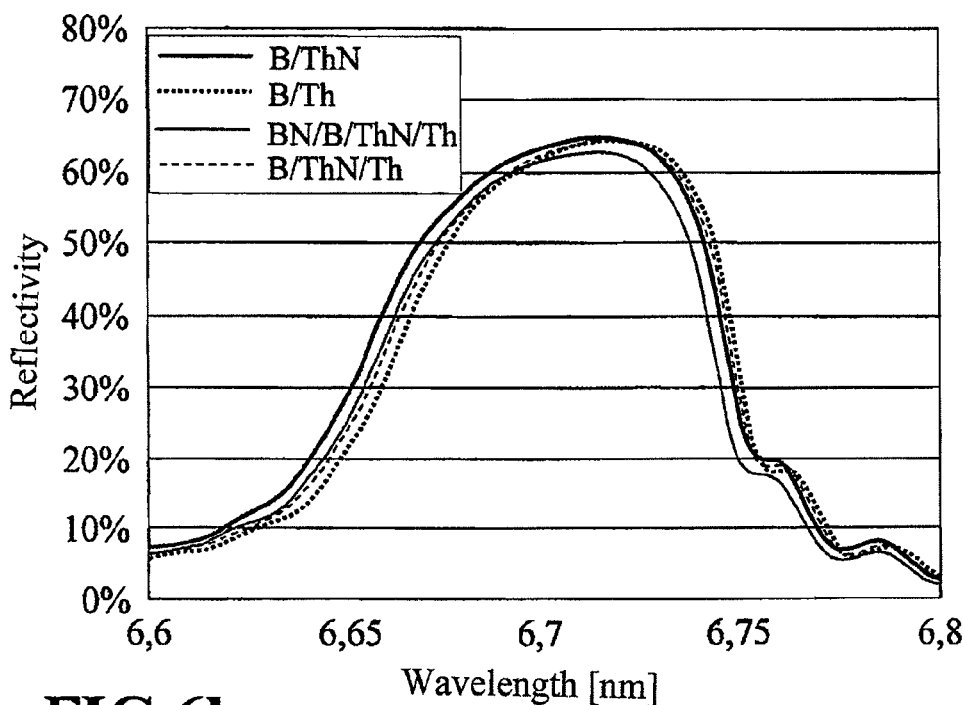
FIGS. 6a, b show the reflectivity as a function of the wavelength for reflective optical elements having multilayer systems with thorium as an absorber and thorium carbide intermediate layers.
Figure 6B:
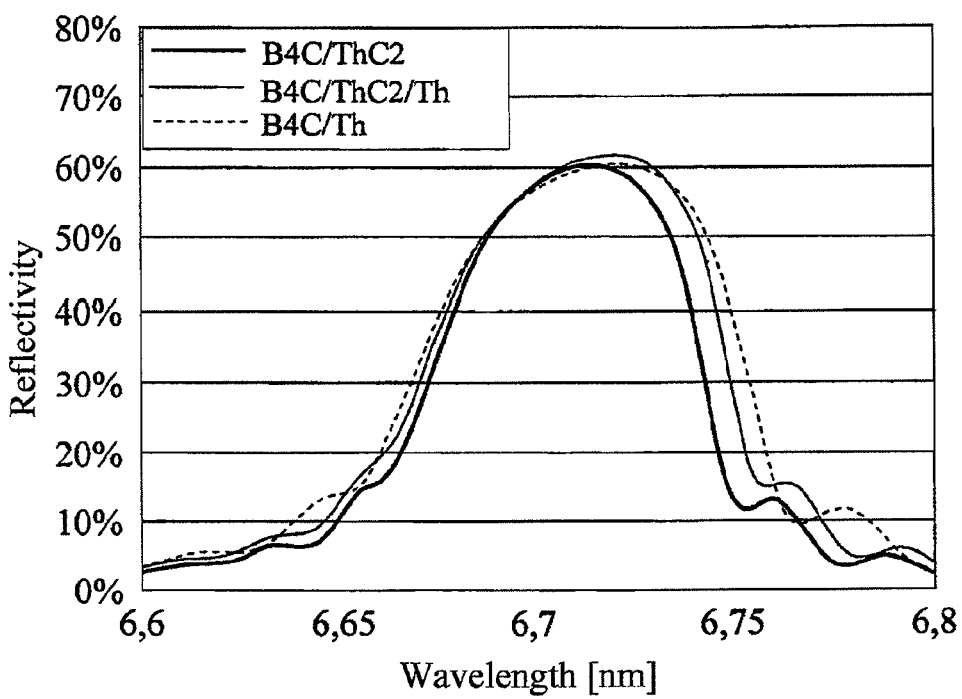

FIGS. 6a, b show corresponding thorium/boron and thorium/boron carbide systems with carbide instead of nitride layers. Herein, the introduction of the carbide layers in all systems leads to a slight deterioration of the reflectivity in comparison with the unchanged thorium/boron or thorium/boron carbide systems, which are shown as a broken line. However, the carbide layer or layers lead(s) to the thermal and thermodynamic stability being improved so that the useful life of the corresponding reflective optical elements is longer while reflectivity stays essentially the same.

Figure 7A:
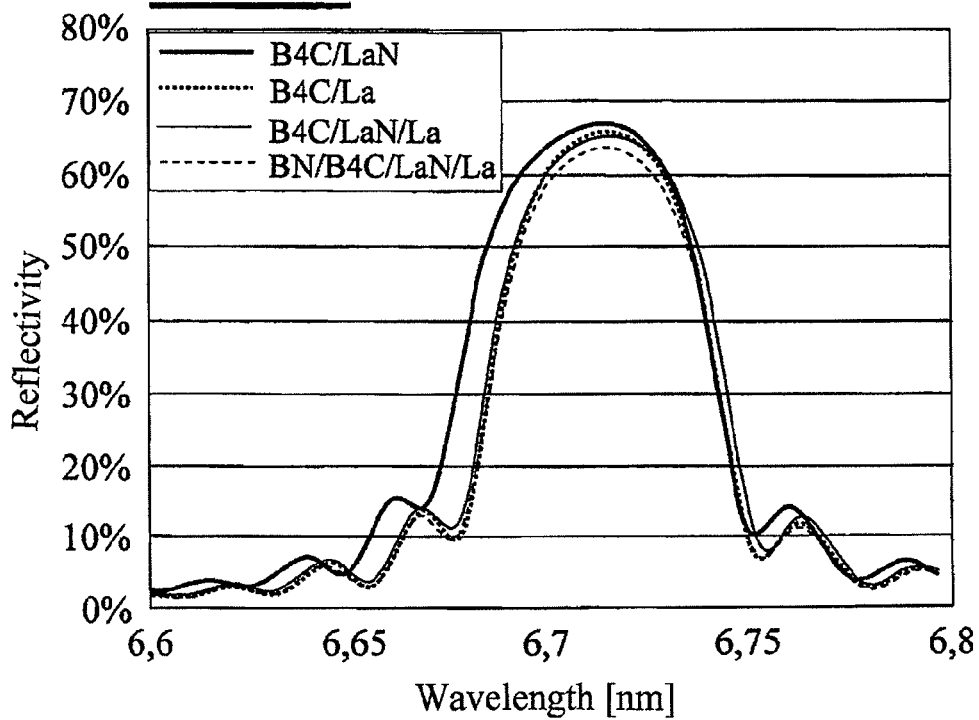
FIGS. 7a, b show the reflectivity as a function of the wavelength for reflective optical elements having multilayer systems with lanthanum as an absorber and lanthanum nitride intermediate layers.
Figure 7B:
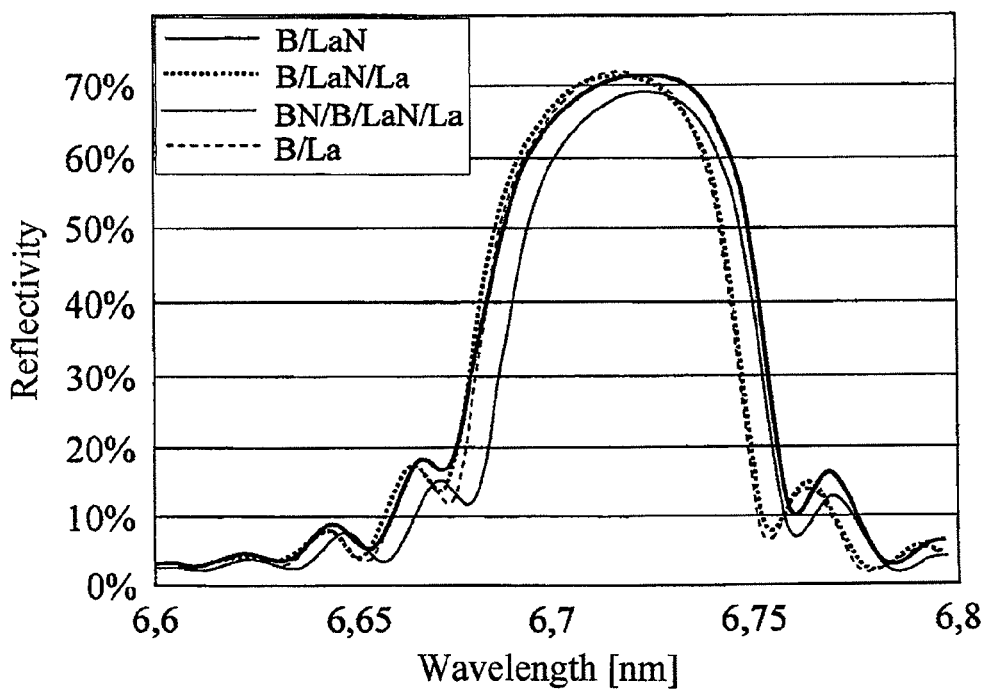

FIG. 7a shows the reflectivity curves for the lanthanum/boron carbide system alone or with one or two additional nitride layers and the lanthanum/boron carbide system. The system having two nitride layers has the lowest maximum reflectivity and a slightly smaller bandwidth. In compensation, it has a high thermal and thermodynamic stability. Both the provision of a lanthanum nitride intermediate layer and lanthanum nitride as an absorber material results in increased bandwidths in comparison to lanthanum/boron, wherein this effect is particularly pronounced with lanthanum nitride as an absorber material. This can basically also be seen for the corresponding systems having boron as a spacer material, as shown in FIG. 7b. With lanthanum nitride as an absorber material and boron carbide as a spacer material, the maximum reflectivity is additionally increased.

Figure 8A:
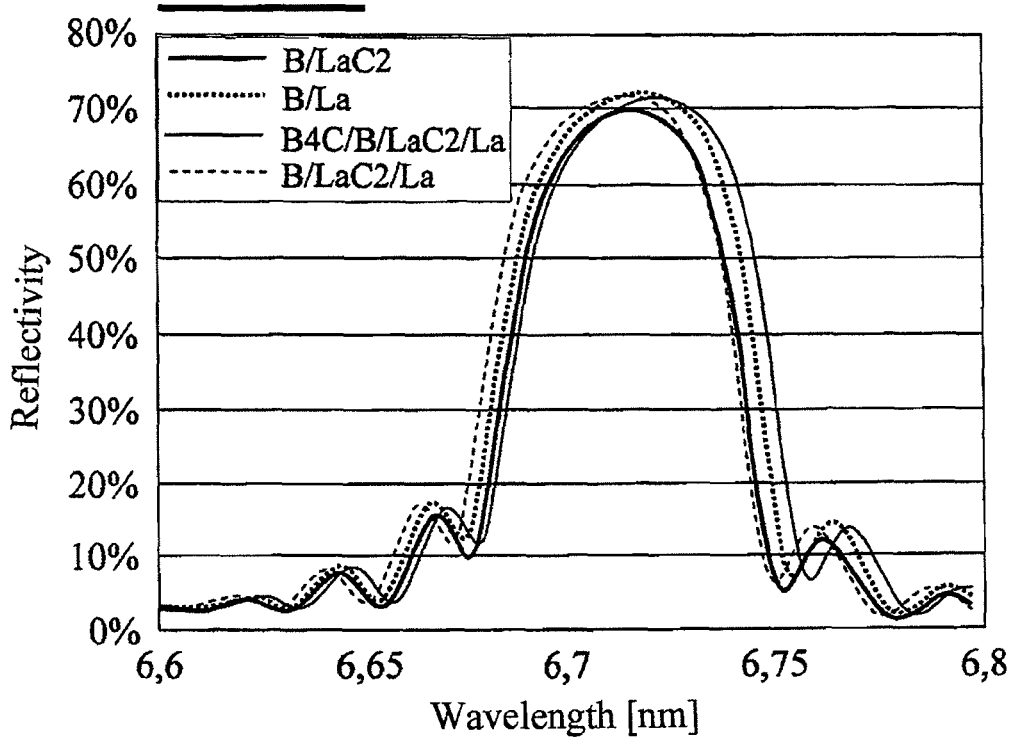
FIGS. 8a, b show the reflectivity as a function of the wavelength for reflective optical elements having multilayer systems with lanthanum as an absorber and lanthanum carbide intermediate layers.

FIG. 8a shows the reflectivity curves for the lanthanum/boron system alone or with one or two additional carbide layers and the lanthanum/boron system. The carbide layers do not result in a noticeable deterioration in reflectivity. However, the position of the maximum reflectivity and therefore the operating wavelength is slightly shifted. In compensation, these systems have increased thermal and thermodynamic stability. In the lanthanum carbide/boron system there is a slight deterioration in reflectivity, which, however, is compensated by a longer useful life due to an increased thermodynamic and thermal stability.

Figure 8B:
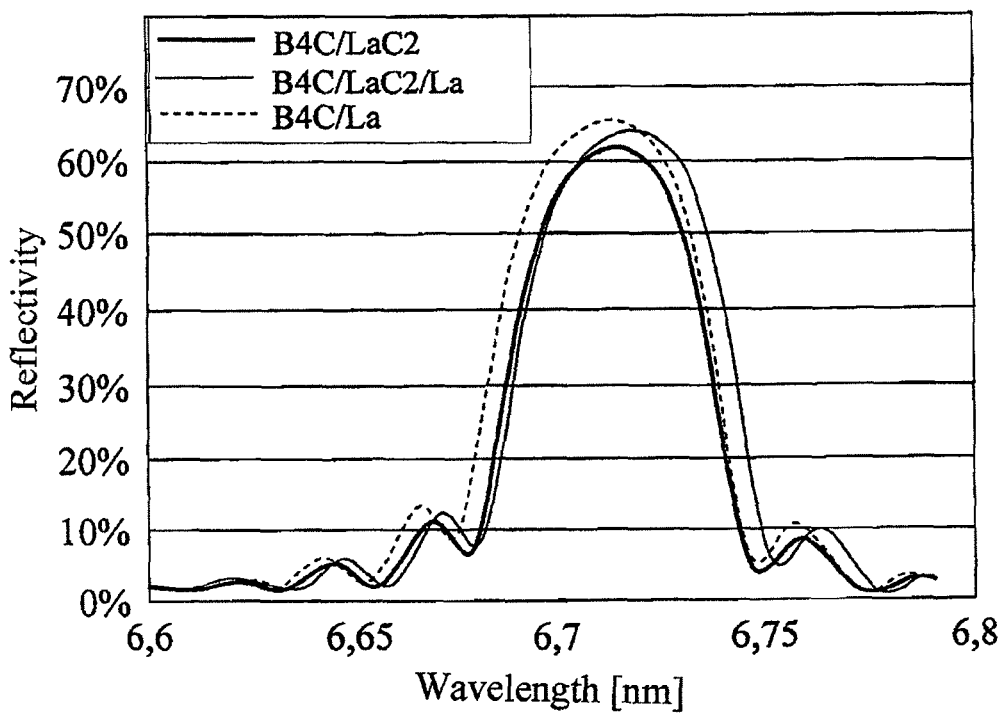

For the case of the reflectivity curves shown in FIG. 8b for the lanthanum/boron carbide system alone or with an additional lanthanum carbide intermediate layer, or for the lanthanum carbide/boron carbide system, both systems comprising lanthanum carbide lead to a somewhat deteriorated reflectivity. This is compensated, however, by a longer useful life, because the individual layers intermix less over time, in particular, at increased temperatures, than with lanthanum/boron carbide.

A particular advantage of the reflective optical elements described here is that they can be operated for a sufficiently long lifespan not only at room temperature but also at operating temperatures of up to 600° C. It is therefore not necessary to cool the reflective optical elements even if the radiation intensity impinging on the reflective optical elements is high. Even the collimator mirror of an EUV lithography apparatus that is usually exposed to the highest radiation intensity, can be operated without cooling.

Figure 9:
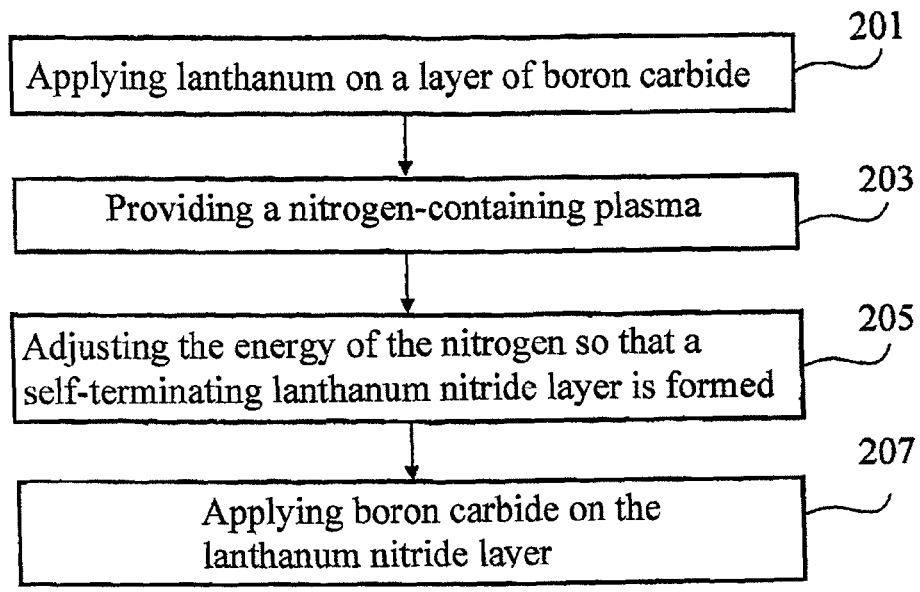
FIG. 9 shows a flow diagram referring to a first embodiment of a method for manufacturing reflective optical elements.

FIG. 9 shows a first embodiment of a method for manufacturing reflective optical elements having the above explained multilayer systems, taking a lanthanum/boron carbide system with an intermediate layer of lanthanum nitride to increase the thermodynamic and thermal stability as an example. For this purpose, in a first step 201, a layer of lanthanum is applied to a layer of boron carbide. For this purpose, all known methods, such as sputtering, vapor deposition and similar processes can be used. Subsequently, a nitrogen-containing plasma is provided (step 203). For this purpose, a plasma, for example, in a nitrogen-containing atmosphere can be ignited. Herein, the energy of the nitrogen is adjusted in such a manner that a self-terminating lanthanum nitride layer is formed (step 205). The energy should be low enough to ensure that the penetration depth of the nitrogen radicals, molecules or ions does not exceed the thickness of a monolayer of lanthanum nitride. A minimum energy is necessary, however, to induce a reaction of the nitrogen with the lanthanum on the layer surface of the lanthanum nitride at all. To adjust the nitrogen energy, the energy supply to the plasma can be adjusted, or an additional accelerating voltage could also be applied. Kaufmann sources, radio frequency plasma sources or cyclotron resonance plasma sources could be used as sources. Advantageously, nitrogen radicals, ions or molecules are used having an energy of up to 120 eV, preferably up to 100 eV, particularly preferably up to 80 eV, most preferably up to 50 eV. Advantageously, the coating geometry is selected in such a manner that the incident angle of the nitrogen on the surface to be coated is as small as possible to additionally limit the penetration depth. Ideally, the particle energy approaches 0 eV when nitriding a layer. This also applies if a self-terminating carbide layer with carbon atoms, radicals, ions or carbon-containing molecules is to be applied. Finally, a boron carbide layer is applied to the lanthanum nitride layer in a conventional manner (step 207). These method steps are repeated depending on the desired number of stacks.

Figure 10:
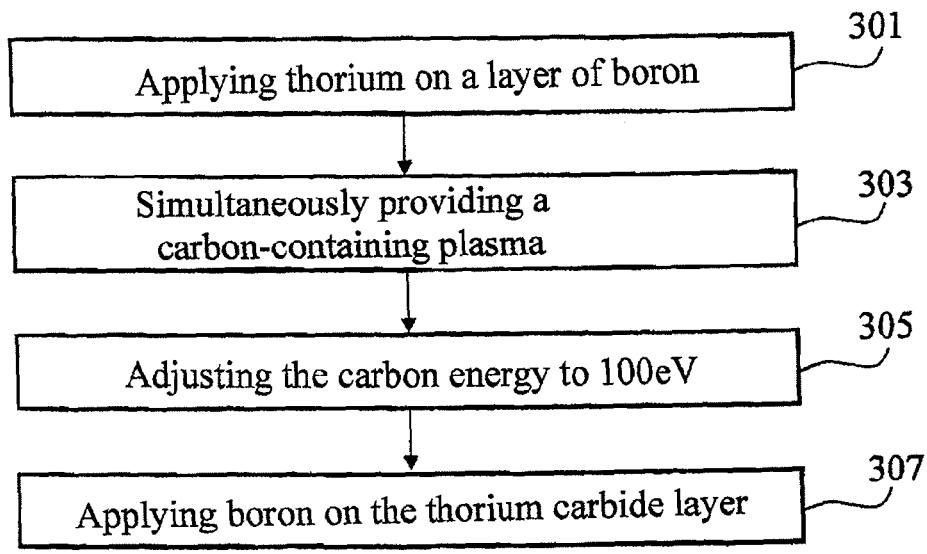
FIG. 10 shows a flow diagram referring to a second embodiment of a method for manufacturing reflective optical elements.

FIG. 10 shows a further exemplary embodiment of a method of manufacture: thorium is applied to a boron layer (step 301). Simultaneously, a carbon-containing plasma is provided, for example, with the aid of the above-mentioned sources (step 303). The carbon can be provided, for example, by introducing carbon-containing gas, such as methane or ethane. Preferably, acetylene is used to keep the hydrogen concentration as low as possible. For a homogeneous thorium carbide layer to form, in the present example, the plasma energy is adjusted in such a manner that the carbon has an energy of about 100 eV (step 305). Finally, a boron layer is applied to the thorium layer in a conventional manner (step 309). These method steps are repeated depending on the desired number of stacks. To achieve carbiding, in a variant, a sputtering method could also be used, for example, in addition or alternatively to the plasma processing.

It should be noted that each of the exemplary embodiments of the method of manufacture described here could easily be modified by applying a different absorber material, a different spacer material or different carbide or nitride layers of different thicknesses by means of various carbon or nitrogen energies.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A reflective optical element configured for an operating wavelength in the range from 5 nm to 12 nm, comprising:
 a multilayer system with respective layers of at least two alternating materials having differing real parts of the refractive index at the operating wavelength, wherein the material having the lower real part of the refractive index is a nitride or a carbide.

2. The reflective optical element according to claim 1, wherein the material having the lower real part of the refractive index is lanthanum nitride, thorium nitride, lanthanum carbide or thorium carbide.

3. The reflective optical element according to claim 1, wherein the material having the higher real part of the refractive index is boron or boron carbide.

4. A reflective optical element configured for an operating wavelength in the range from 5 nm to 12 nm, comprising:
 a multilayer system with respective layers of at least two alternating materials having differing real parts of the refractive index at the operating wavelength, wherein the material having the lower real part of the refractive index is thorium, uranium or barium and the material having the higher real part of the refractive index is boron or boron carbide.

* * * * *

UNITED STATES PATENT AND TRADEMARK OFFICE
CERTIFICATE OF CORRECTION

PATENT NO. : 8,638,494 B2  
APPLICATION NO. : 13/791100  
DATED : January 28, 2014  
INVENTOR(S) : Tsarfati et al.

Page 1 of 1

It is certified that error appears in the above-identified patent and that said Letters Patent is hereby corrected as shown below:

On the Title Page, Item [72]: Residence of inventor Eric Louis: delete "Ljsselstein" and insert -- IJsselstein --

On the Title Page, Item [57]: Abstract, Line 7: delete ""Alternatively" and insert -- Alternatively --

In the Specification

Column 2, Line 22: delete "real part" and insert -- real parts --

Column 3, Line 27: delete "20° C. to" and insert -- 20° C to --

Column 6, Line 43: delete "particular, at" and insert -- particular at --

Column 9, Line 3: delete "particular, at" and insert -- particular at --

Signed and Sealed this  
Tenth Day of June, 2014

Michelle K. Lee  
*Deputy Director of the United States Patent and Trademark Office*